(12) United States Patent
Kim et al.

(10) Patent No.: US 12,106,732 B2
(45) Date of Patent: Oct. 1, 2024

(54) DISPLAY DEVICE

(71) Applicant: Samsung Display Co., Ltd., Yongin-si (KR)

(72) Inventors: Wontae Kim, Hwaseong-si (KR); Jae-Han Lee, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 396 days.

(21) Appl. No.: 17/682,892

(22) Filed: Feb. 28, 2022

(65) Prior Publication Data

US 2022/0293064 A1 Sep. 15, 2022

(30) Foreign Application Priority Data

Mar. 3, 2021 (KR) .......................... 10-2021-0027955

(51) Int. Cl.
*H05K 1/14* (2006.01)
*G09G 5/00* (2006.01)
*H05K 1/18* (2006.01)
*H10K 59/131* (2023.01)

(52) U.S. Cl.
CPC ............ *G09G 5/003* (2013.01); *H05K 1/147* (2013.01); *H05K 1/189* (2013.01); *H10K 59/131* (2023.02)

(58) Field of Classification Search
CPC ........ G09G 5/003; H05K 1/147; H05K 1/189; H10K 59/131
See application file for complete search history.

(56) References Cited

U.S. PATENT DOCUMENTS

| 2011/0084895 A1 | 4/2011 | Park et al. |
| 2015/0219947 A1* | 8/2015 | Moh ................ G02F 1/13452 |
| | | 349/33 |
| 2021/0307171 A1* | 9/2021 | Oh .................... H05K 1/147 |

FOREIGN PATENT DOCUMENTS

| KR | 10-0658648 B1 | 12/2006 |
| KR | 10-1031256 B1 | 4/2011 |
| KR | 10-2016-0093806 A | 8/2016 |
| KR | 10-2018-0083520 A | 7/2018 |

* cited by examiner

*Primary Examiner* — David Vu
*Assistant Examiner* — Brandon C Fox
(74) *Attorney, Agent, or Firm* — Lewis Roca Rothgerber Christie LLP

(57) ABSTRACT

A display device includes: a display panel in which pixels are arranged; a first circuit board configured to provide a first driving signal to the display panel; and a second circuit board connecting the display panel and the first circuit board and having a first region in which a driving chip providing a second driving signal to the display panel is arranged and a second region surrounding the first region, the first region and the second region being defined in the second circuit board, wherein: the second circuit board comprises a first line electrically connected to the driving chip and a second line electrically insulated from the driving chip; the second line comprises a common line in the first region; and the width of the common line decreases as the common line becomes farther away from the first circuit board on a plane.

20 Claims, 14 Drawing Sheets

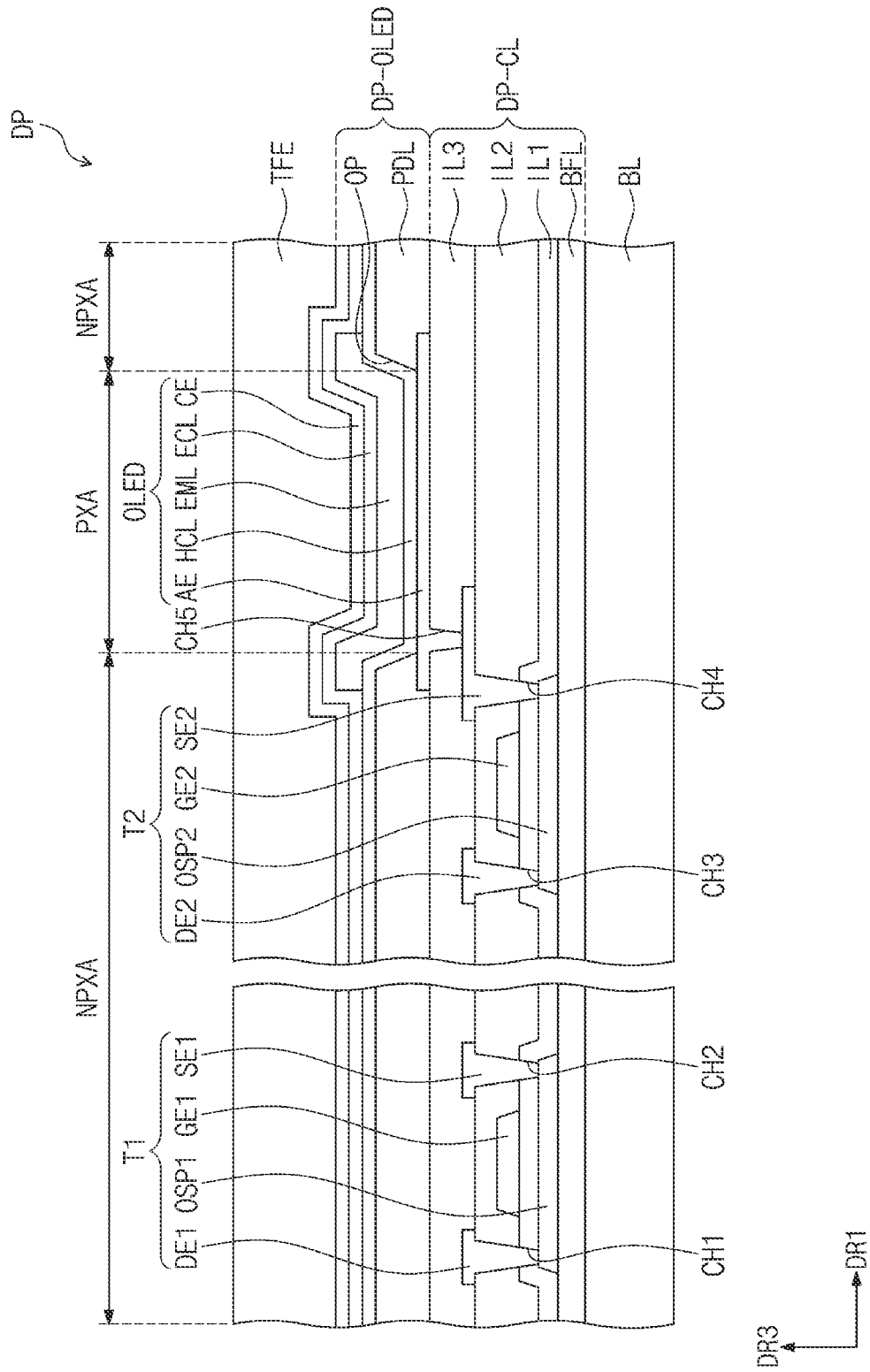

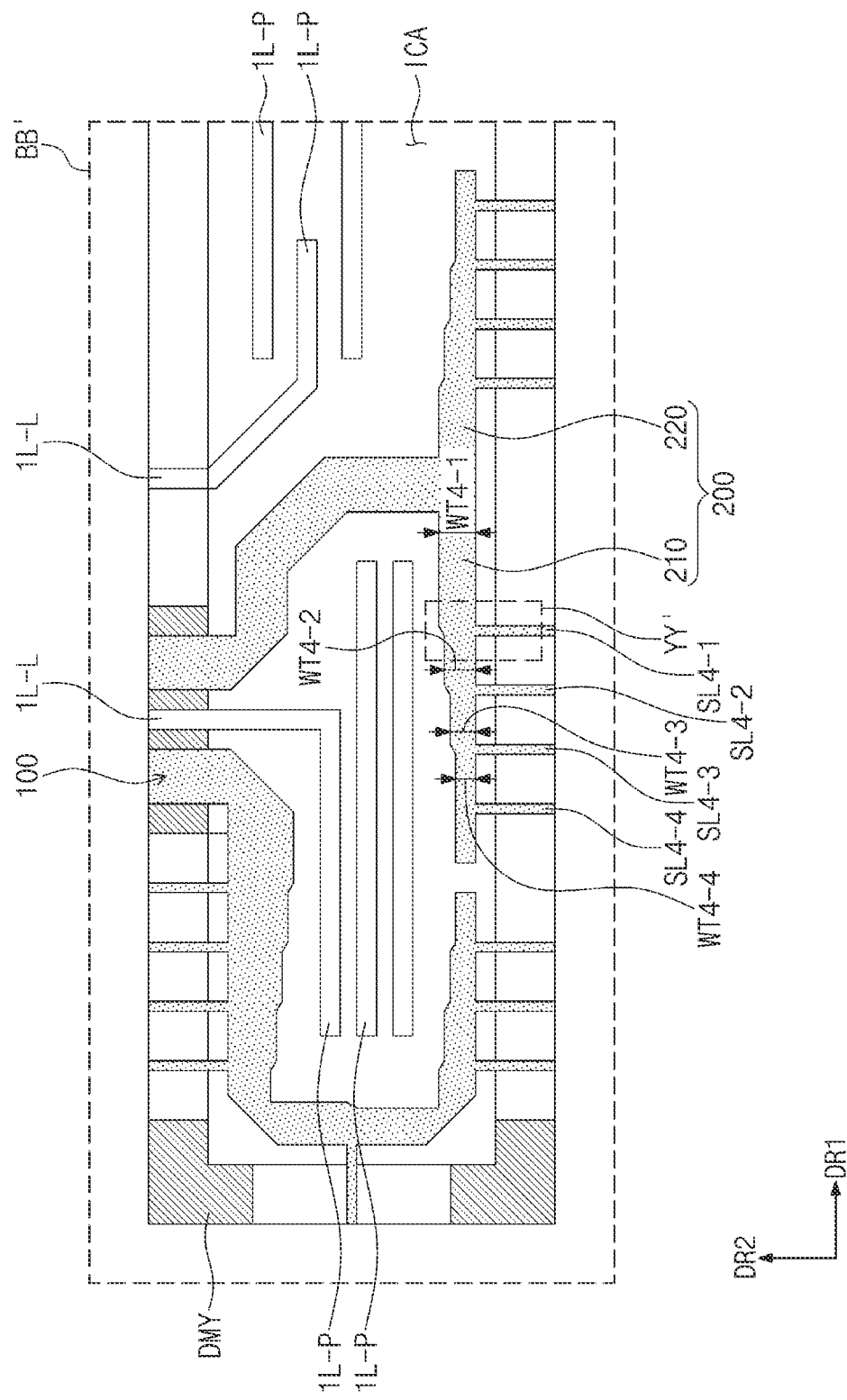

DISPLAY DEVICE

CROSS-REFERENCE TO RELATED APPLICATIONS

The present application claims priority to and the benefit of Korean Patent Application No. 10-2021-0027955, filed on Mar. 3, 2021, the entire content of which is hereby incorporated by reference.

BACKGROUND

Aspects of some embodiments of the present disclosure herein relate to a display device.

In general, a display panel may be manufactured and then a circuit board is connected to the display panel. For example, in a "tape automated bonding" (TAB) mounting method, a circuit board may be bonded to a display panel by using an anisotropic conductive film (ACF).

Recently, as a bezel region (or non-display region) is reduced, design proposals for a display device having strong durability are being actively studied.

The above information disclosed in this Background section is only for enhancement of understanding of the background and therefore the information discussed in this Background section does not necessarily constitute prior art.

SUMMARY

Aspects of some embodiments of the present disclosure herein relate to a display device, and for example, to a display device with relatively improved line arrangement efficiency.

Aspects of some embodiments of the present disclosure include a display device in which a power line connected to a display panel is space is relatively-efficiently arranged on a circuit board.

According to some embodiments of the inventive concept a display device includes: a display panel in which pixels are located; a first circuit board configured to provide a first driving signal to the display panel; and a second circuit board connecting the display panel and the first circuit board and having a first region in which a driving chip providing a second driving signal to the display panel is located and a second region surrounding the first region, the first region and the second region being defined in the second circuit board, wherein: the second circuit board includes a first line electrically connected to the driving chip and a second line electrically insulated from the driving chip; the second line includes a common line in the first region; and the width of the common line decreases as the common line becomes farther away from the first circuit board on a plane.

According to some embodiments, the common line includes: a first portion adjacent to the first circuit board and extending in a first direction; a second portion having one end connected to the first portion and extending in a direction away from the first circuit board in a second direction orthogonal to the first direction from the first portion; and a third portion extending in the first direction from the other end opposite to the one end of the second portion and adjacent to the display panel, wherein a first width of the first portion may be greater than a second width of the second portion and the second width may be greater than a third width of the third portion.

According to some embodiments, the second line may include at least one power line configured to provide power to the display panel.

According to some embodiments, the second line may further include a plurality of output lines extending to the second region from the common line, and the widths of the plurality of output lines may all be the same as each other.

According to some embodiments, the output lines may include n number of first output lines connected to the first portion, m number of second output lines connected to the second portion, and l number of third output line connected to the third portion.

According to some embodiments, the number of the plurality of output lines connected to the common line may be proportional to the width of the common line.

According to some embodiments, the first width of the first portion may be proportional to the total sum of the number of the first output lines, the number of the second output lines, and the number of the third output lines; the second width of the second portion may be proportional to the sum of the number of the second output lines and the number of the third output lines; and the third width of the third portion may be proportional to the number of the third output lines.

According to some embodiments, $A=(n+m+l)x+a$ um, $B=(m+l)x+a$ um, and $C=lx+a$ um, where the width of each of the plurality of output lines is x um, the first width is A, the second width is B, and the third width is C, $A=(n+m+l)x+a$ um.

According to some embodiments, the a may be 0.

According to some embodiments, the a is a stabilization constant and may be about twice the width x of each of the output lines.

According to some embodiments, the first line may include a pad portion in the first region and connected to the driving chip, and a line portion in the second region.

According to some embodiments, the common line may be in the first region so as to bypass the pad portion.

According to some embodiments, the second line may include z number of output lines connected to the common line and extending to the second region, and the width of the common line may be reduced by y um whenever the common line passes by each of the output lines in a direction away from the first circuit board.

According to some embodiments, the width of each of the output lines may be x um, and the y may be the same as the x.

According to some embodiments, the width of each of the output lines may be x um, the y may be greater by a um than the x, and the a may be about twice the x.

According to some embodiments, the maximum value of the width of the common line may be xz um, and the minimum value thereof may be x um.

According to some embodiments of the inventive concept, a display device includes: a display panel; a first circuit board configured to provide a first driving signal to the display panel; and a second circuit board connecting the display panel and the first circuit board and having a first region in which a driving chip providing a second driving signal to the display panel is located and a second region surrounding the first region, the first region and the second region being defined in the second circuit board, wherein: the second circuit board includes a first line electrically connected to the driving chip and a second line electrically insulated from the driving chip; the second line includes a common line including a first common portion in the first region and extending in one direction from a first direction and a second common portion extending in another direction opposite to the one direction; and each of the widths of the first common portion and the second common portion decreases as the first and second common portions become farther away from each other.

According to some embodiments, the second line includes a plurality of output lines connected to the common line and located in the second region, and a difference between a maximum value and a minimum value of the width of the common line may be proportional to the number of the output lines.

According to some embodiments, the plurality of output lines may include a plurality of first output lines connected to the first common portion and a plurality of second output lines connected to the second common portion, wherein the number of the first output lines and the number of the second output lines may be the same as each other.

According to some embodiments, the width of the first common portion may decrease by the width of each of the first output lines whenever the first common portion passes by the first output lines in a direction away from the second common portion, and the width of the second common portion may decrease by the width of each of the second output lines whenever the second common portion passes by the second output lines in a direction away from the first common portion.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIG. 5 is an enlarged cross-sectional view of a display panel according to some embodiments of the inventive concept;

FIGS. 10A and 10B are enlarged views of partial regions of the chip-mounting region in FIG. 7 according to some embodiments of the inventive concept.

DETAILED DESCRIPTION

Figure 1A:
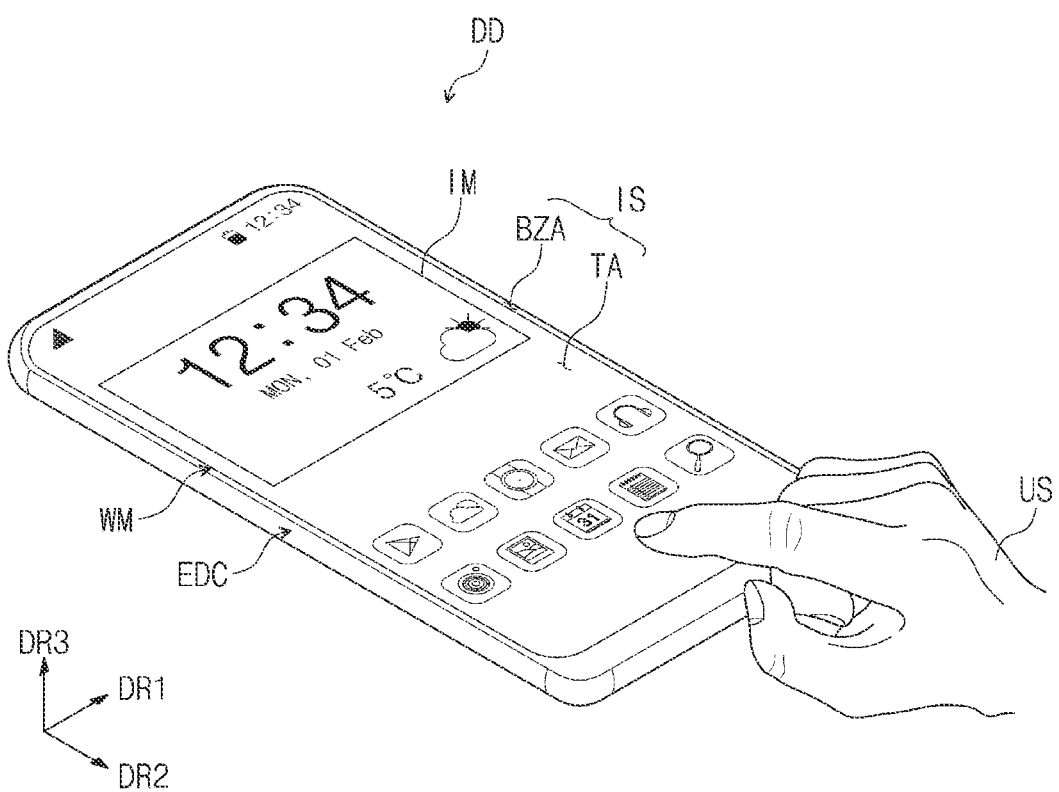
FIG. 1A is a perspective view of a display device according to some embodiments of the inventive concept.

In this specification, it will be understood that when an element (or region, layer, portion, etc.) is referred to as being "on", "connected to" or "coupled to" another element, it can be directly on, connected or coupled to the other element, or intervening elements may be present.

Like reference numerals refer to like elements throughout. In addition, in the drawings, the thicknesses, ratios, and dimensions of elements are exaggerated for effective description of the technical contents. As used herein, the term "and/or" includes any and all combinations that the associated configurations can define.

It will be understood that, although the terms first, second, etc. may be used herein to describe various elements, these elements should not be limited by these terms. These terms are only used to distinguish one element from another element. For example, a first element could be termed a second element without departing from the scope of the present invention. Similarly, the second element may also be referred to as the first element. The terms of a singular form include plural forms unless otherwise specified.

Terms, such as "below", "lower", "above", "upper" and the like, are used herein for ease of description to describe one element's relation to another element(s) as illustrated in the figures. The above terms are relative concepts and are described based on the directions indicated in the drawings.

It will be understood that the terms "include" and/or "have", when used in this specification, specify the presence of stated features, integers, steps, operations, elements, components and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the inventive concept will be described with reference to the accompanying drawings.

Figure 1B:
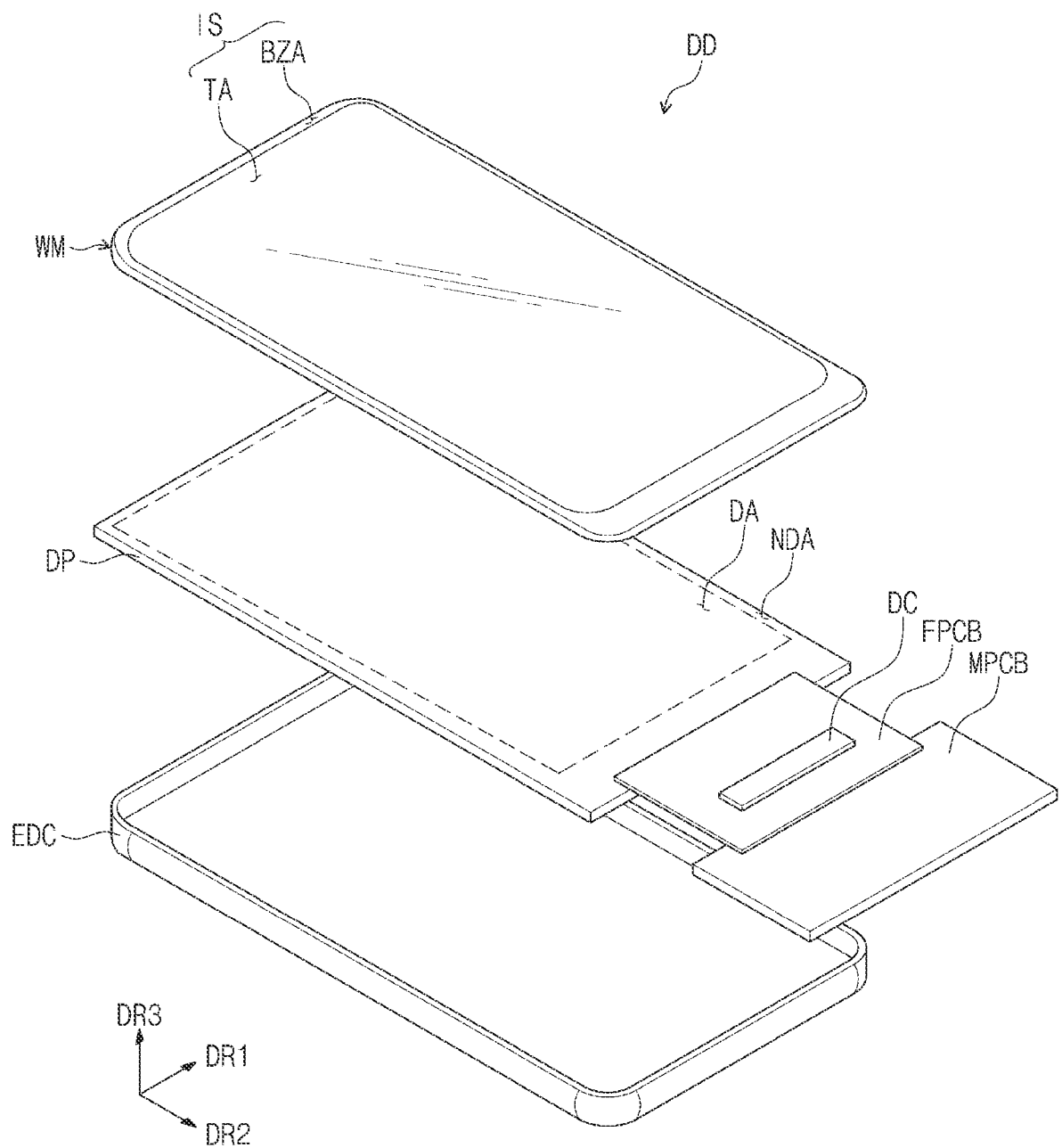
FIG. 1B is an exploded perspective view of the display device according to some embodiments of the inventive concept.

FIG. 1A is a perspective view of a display device according to some embodiments of the inventive concept. FIG. 1B is an exploded perspective view of the display device according to some embodiments of the inventive concept.

Referring to FIGS. 1A and 1B, the display device DD may be activated according to an electrical signal. The display device DD may include various embodiments, applications, or use cases. For example, the display device DD may be applied to display devices for a variety of electronic devices, such as a smart watch, a tablet computer, a laptop computer, a computer, a smart television, and the like.

The display device DD may display images IM toward a third direction DR3 on a display surface IS parallel to each of a first direction DR1 and a second direction DR2. The display surface IS on which images IM are displayed may correspond to a front surface of the display device DD. The images IM may include dynamic (e.g., video) images or still (e.g., static) images.

According to some embodiments, a front surface (or upper surface) and a rear surface (or lower surface) of each member are defined based on a direction in which images IM are displayed. The front and rear surfaces are opposed to each other in the third direction DR3, and a normal direction of each of the front and rear surfaces may be parallel to the third direction DR3.

The separation distance between the front and rear surfaces in the third direction DR3 may correspond to the thickness of the display device DD in the third direction DR3. Meanwhile, the directions indicated by the first to third directions DR1, DR2, and DR3 are relative concepts and may be converted into other directions.

The display device DD may sense an external input applied from the outside. The external input may include various types of inputs provided from the outside. The display device DD according to some embodiments of the inventive concept may sense a user's touch US applied from the outside. A user's touch US may be any one of various types of external inputs such as a part of a user's body, light, heat, or pressure, or a combination thereof. According to some embodiments, a user's touch US is described, for example, as a touch input (e.g., by a user's hand, or other objects, such as a stylus) applied to the front surface, but this is just an illustrative example, and as described above, a first input TC1 by a user's touch US may be provided in various forms. In addition, the display device DD may sense a user's touch US applied to a side or rear surface of the display device DD depending on the structure of the display device DD, and embodiments of the inventive concept are not limited thereto.

In addition, the display device DD according to some embodiments of the inventive concept may sense inputs by an input device (e.g., a stylus pen, an active pen, a touch pen, an electronic pen, and an e-pen) besides a user's touch.

The front surface of the display device DD may be divided into a transmission region TA and a bezel region BZA. The transmission region TA may be a region in which images IM are displayed. A user visually recognizes or views images IM that are displayed at or through the transmission region TA. According to some embodiments, the transmission region TA is illustrated in a tetragonal shape with rounded vertices. However, this is illustrated as an example, and the transmission region TA may have various shapes and is not limited to any one shape.

The bezel region BZA is adjacent to the transmission region TA. The bezel region BZA may have a color (e.g., a set or predetermined color). The bezel region BZA may surround the transmission region TA. That is, the bezel region BZA may be located in a periphery (or outside a footprint) of the transmission region TA. Accordingly, the shape of the transmission region TA may be substantially defined by the bezel region BA. However, this is illustrated as an example, and the bezel region BZA may be located adjacent to one side of the transmission region TA and may be omitted. The display device DD according to some embodiments of the inventive concept may include various shapes or arrangements and is not limited to any one shape.

As illustrated in FIG. 1B, the display device DD may include a window WM and a display panel DP. The window WM may be located on the display panel DP. An input sensor may be located on the display panel DP. The input sensor ISP may be formed on the display panel DP by a continuous process. The display panel DP outputs images IM and the input sensor ISP obtains coordinate information of an external input.

The window WM transmits images of the display panel DP. That is, the window WM may have a transmission region TA through which images generated by the display panel DP pass (or may be viewed) and a bezel region BA surrounding the transmission region TA, the transmission region TA and the bezel region BA being defined therein.

The window WM may be made of a transparent material capable of displaying images IM. For example, the window WM may be made of glass, sapphire, plastic, or the like. The window WM is illustrated as a single layer, but is not limited thereto and may include a plurality of layers according to some embodiments.

The display panel DP according to some embodiments of the inventive concept may be a light-emitting display panel but is not particularly limited thereto. For example, the display panel DP may be an organic light-emitting display panel or a quantum dot light-emitting display panel. The light-emitting layer of the organic light-emitting display panel may contain an organic light-emitting material. The light-emitting layer of the quantum dot light-emitting display panel may contain quantum dots, quantum rods, and the like. Hereinafter, the display panel DP is described as an organic light-emitting display panel.

FIGS. 1A and 1B illustrate a display device DD having a flat structure, but embodiments of the inventive concept are not limited thereto. The display device DD may be bent or folded along a folding axis and may have a slidable structure.

According to some embodiments, a reflection prevention layer may be further located between the window WM and the display panel DP. The reflection prevention layer reduces reflectivity of external light that is incident from an upper side of the window WM. The reflection prevention layer according to some embodiments of the inventive concept may include a retarder and a polarizer. The retarder may be a film type or a liquid crystal coating type and may include a $\lambda/2$ retarder and/or a $\lambda/4$ retarder. The polarizer may also be a film type or a liquid crystal coating type. The film type may include an elongation synthetic resin film, and the liquid crystal coating type may include liquid crystals arranged in an arrangement (e.g., a set or predetermined arrangement). The retarder and the polarizer may be implemented as a single polarizing film.

The display panel DP may display images according to an electrical signal and transmit/receive information about an external input. The display panel DP may have a display region DA and a non-display region NDA defined therein. The display region DA may be defined as a region that displays images provided from the display panel DP.

The non-display region NDA is adjacent to the display region DA. For example, the non-display region NDA may surround the display region DA. However, this is illustrated as an example, and the non-display region NDA may be defined in various shapes and is not limited to any one shape. According to some embodiments of the inventive concept, the display region DA of the display panel DP may correspond to at least a portion of the transmission region TA.

The display device DD may further include a main circuit board MPCB, a flexible circuit film FPCB, and a driving chip DC. The main circuit board MPCB may be connected to the flexible circuit film FPCB to be electrically connected to the display panel DP. The main circuit board MPCB may include a plurality of driving elements. The plurality of driving elements may include a circuit unit for driving the display panel DP. The flexible circuit film FPCB is connected to the display panel DP to electrically connect the display panel DP and the main circuit board MPCB. The driving chip DC may be mounted on the flexible circuit film FPCB.

The driving chip DC may include driving elements—for example, a data driving circuit—for driving the pixels of the display panel DP. The flexible circuit film FPCB according to some embodiments of the inventive concept is illustrated as one film, but the number of the flexible circuit film FPCB is not limited thereto and may be provided in plurality and be connected to the display panel DP. Hereinafter, the main circuit board MPCB is described as a first circuit board MPCB and the flexible circuit board FPCB is described as a second circuit board FPCB.

Referring to FIG. 1B, the display device DD further includes an external case EDC accommodating the display panel DP. The external case EDC may be combined with the window WM to define the appearance of the display device DD. The external case EDC absorbs the shock applied from the outside and prevents or reduces instances of a foreign material, moisture, and the like penetrating into the display panel DP to protect the components accommodated in the external case EDC. Meanwhile, as an example of the present invention, the external case EDC may be provided in a form in which a plurality of storage members are combined therewith.

The display device DD according to some embodiments of the inventive concept may further include: an electronic module including various functional modules for operating the display panel DP; a power supply module for supplying power necessary for overall operation of the display device DD; a display module DM; and/or a bracket for dividing the internal space of the display device DD by being combined with the external case EDC.

Figure 2:
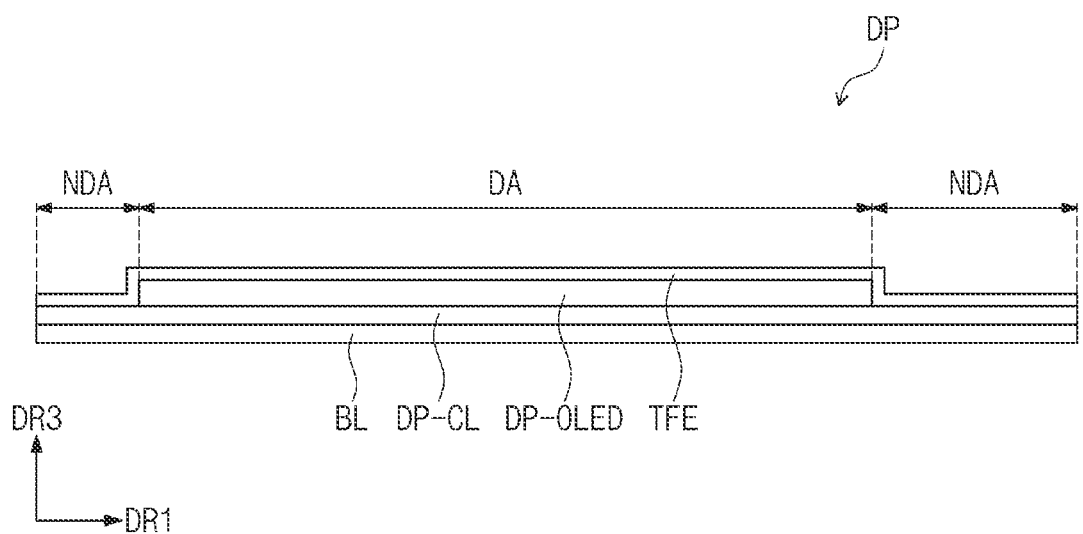
FIG. 2 is a cross-sectional view of a display panel according to some embodiments of the inventive concept.
Figure 3:
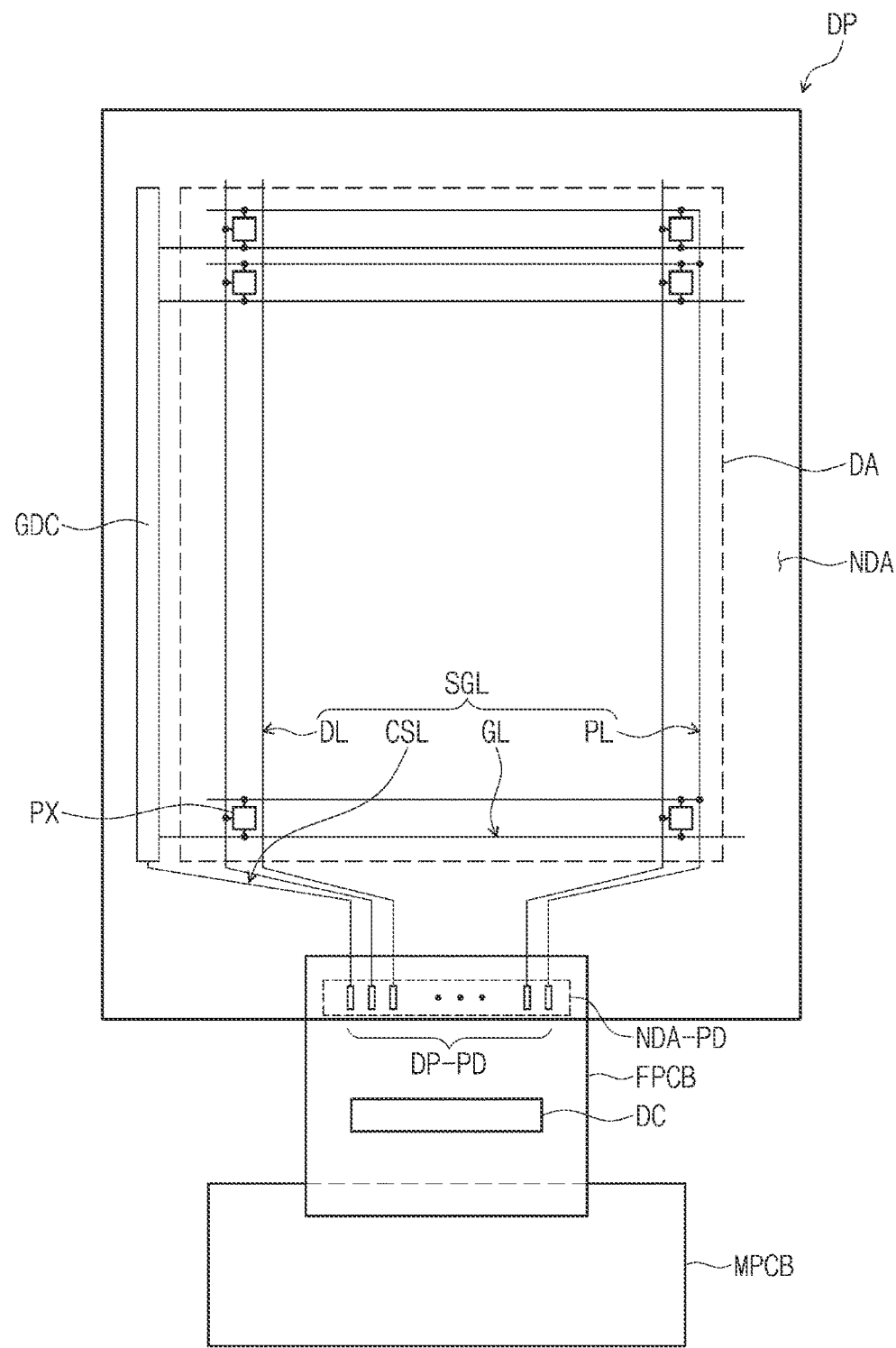
FIG. 3 is a plane view of the display panel according to some embodiments of the inventive concept.

FIG. 2 is a cross-sectional view of a display panel according to some embodiments of the inventive concept. FIG. 3 is a plane view of the display panel according some embodiments of the inventive concept.

As illustrated in FIG. 2, the display panel DP includes a base layer BL, a circuit element layer DP-CL located on the base layer BL, a display element layer DP-OLED, and a thin-film encapsulation layer TFE. According to some embodiments, the display panel DP may further include functional layers such as a reflection prevention layer and a refractive index control layer.

The base layer BL may include a synthetic resin film. A synthetic resin layer is formed on a working substrate used in manufacturing the display panel DP. Thereafter, a conductive layer and an insulating layer are formed on the synthetic resin layer. When the working substrate is removed, the synthetic resin layer corresponds to the base layer BL. The synthetic resin layer may be a polyimide-based resin layer, and the material thereof is not particularly limited thereto. In addition, the base layer BL may include a glass substrate, a metal substrate, or an organic/inorganic composite material substrate, and the like.

The circuit element layer DP-CL includes at least one insulating layer and a circuit element. Hereinafter, the insulating layer included in the circuit element layer DP-CL is referred to as an intermediate insulating layer. The intermediate insulating layer includes at least one intermediate inorganic film and at least one intermediate organic film. The circuit element includes a signal line, a pixel driving circuit, and the like. The circuit element layer DP-CL may be formed through a process of forming an insulating layer, a semiconductor layer and a conductive layer by coating, deposition, and the like, and a process of patterning the insulating layer, the semiconductor layer and the conductive layer by a photolithography process.

The display element layer DP-OLED includes a light-emitting element. The display element layer DP-OLED may include organic light-emitting diodes. The display element layer DP-OLED may further include an organic film such as a pixel-defining film.

The thin-film encapsulation layer TFE seals the display element layer DP-OLED. The thin-film encapsulation layer TFE includes at least one insulating layer. The thin-film encapsulation layer TFE according to some embodiments of the inventive concept may include at least one inorganic film (hereinafter, an encapsulation inorganic film). The thin-film encapsulation layer TFE according to some embodiments of the inventive concept may include at least one organic film (hereinafter, an encapsulation organic film) and at least one encapsulation inorganic film.

The encapsulation inorganic film protects the display element layer DP-OLED from moisture/oxygen, and the encapsulation organic film protects the display element layer DP-OLED from foreign substances such as dust particles. The encapsulating inorganic film may include a silicon nitride layer, a silicon oxy nitride layer, a silicon oxide layer, a titanium oxide layer, an aluminum oxide layer, or the like, but the embodiments of the inventive concept are not particularly limited thereto. The encapsulation organic layer may include an acrylic-based organic film and is not particularly limited thereto.

FIG. 3 illustrates a display panel, a first circuit board MPCB, and a second circuit board FPCB.

As illustrated in FIG. 3, the display panel DP includes, on a plane, a display region DA and a non-display region NDA. According to some embodiments, the non-display region NDA may be defined along the border of the display region DA.

The display panel DP may include a driving circuit GDC, a plurality of signal lines SGL (hereinafter, signal lines), a plurality of signal pads DP-PD (hereinafter, signal pads), and a plurality of pixels PX (hereinafter, pixels). The pixels PX are located in the display region DA. Each of the pixels PX includes an organic light-emitting diode and a pixel driving circuit connected thereto. The driving circuit GDC, the signal lines SGL, the signal pads DP-PD, and the pixel driving circuit may be included in the circuit element layer DP-CL illustrated in FIG. 3.

The driving circuit GDC may include a scan driving circuit. The scan driving circuit generates a plurality of scan signals (hereinafter, scan signals) and sequentially outputs the scan signals to a plurality of scan lines GL (hereinafter, scan lines) to be described later. The scan driving circuit may further output another control signal to the driving circuit of the pixels PX.

The scan driving circuit may include a plurality of thin-film transistors formed through the same process as the driving circuit of the pixels PX, for example, a low temperature polycrystalline silicon (LTPS) process or a low temperature polycrystalline oxide (LTPO) process.

The signal lines SGL include scan lines GL, data lines DL, a power line PL, and a control signal line CSL. The scan lines GL are respectively connected to a corresponding pixel PX among the pixels PX, and the data lines DL are respectively connected to a corresponding pixel PX among the pixels PX. The power line PL is connected to the pixels PX. The control signal line CSL may provide control signals to the scan driving circuit.

The signal lines SGL overlap the display region DA and the non-display region NDA. The signal lines SGL may include a pad portion and a line portion. The line portion overlaps the display region DA and the non-display region NDA. The pad portion is connected to the end of the line portion. The pad portion is located in the non-display region NDA and overlaps a corresponding signal pad among the signal pads DP-PD. A region in which the signal pads DP-PD are located in the non-display region NDA may be defined as a pad region NDA-PD.

The line portion substantially connected to the pixel PX constitutes most of the signal lines SGL. The line portion is connected to transistors T1 and T2 (see FIG. 5) of the pixel PX. The line portion may have a single-layered/multi-layered structure, and the line portion may be a single body, or may include two or more parts. The two or more parts are located on different layers and may be connected to each other through a contact hole penetrating an insulating layer located between the two or more parts.

The display panel DP may further include dummy pads located in the pad region NDA-PD. Since the dummy pads are formed through the same process as that of the signal lines SGL, the dummy pads may be located in the same layer as that of the signal lines SGL. The dummy pads may be floating electrodes.

FIG. 3 illustrates a first circuit board MPCB and a second circuit board FPCB electrically connected to the display panel DP.

The first and second circuit boards MPCB and FPCB may be rigid circuit boards or flexible circuit boards. The first circuit board MPCB may be connected to the display panel DP through the second circuit board FPCB. The second circuit board FPCB is electrically connected to the display panel DP through the pad portion DP-PD of the display panel DP.

The first circuit board MPCB may include various driving elements that provide a first driving signal for controlling the operation of the display panel DP. For example, the first circuit board MPCB may include a power element or the like. A driving chip DC for controlling the operation of the display panel DP may be located on the second circuit board FPCB. Since various elements such as a timing control circuit are mounted to control the display Panel DP, the driving chip DC may provide a second driving signal to the display panel DP.

Figure 4:
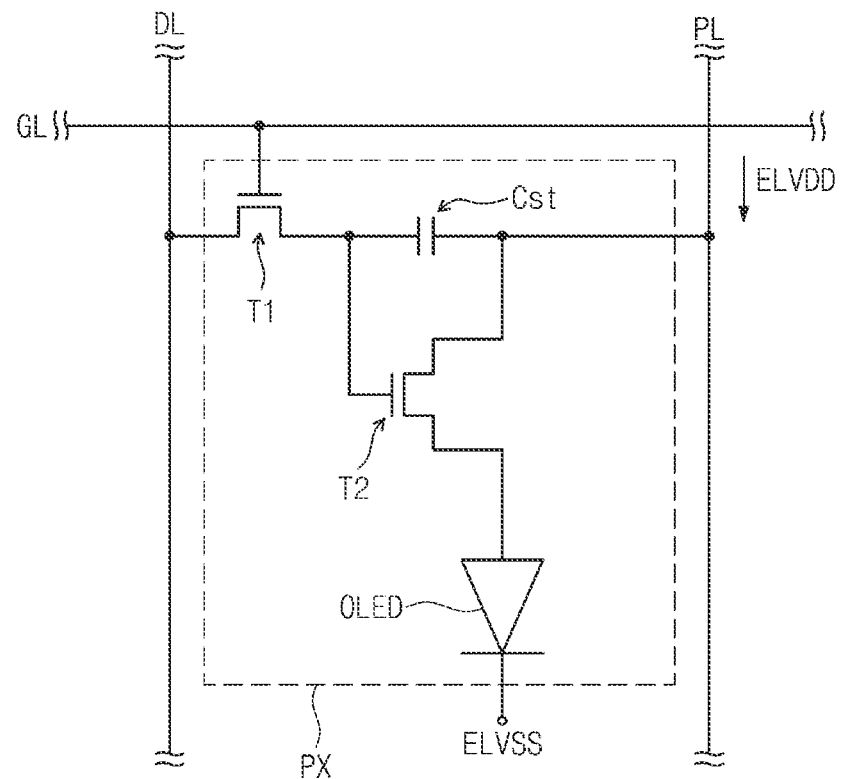
FIG. 4 is an equivalent circuit diagram of a pixel according to some embodiments of the inventive concept.

FIG. 4 is an equivalent circuit diagram of a pixel PX (see FIG. 3) according to some embodiments of the inventive concept. FIG. 5 is an enlarged cross-sectional view of a display panel according to some embodiments of the inventive concept.

FIG. 4 illustrates one scan line GL, one data line DL, a power line PL, and a pixel PX connected thereto. The configuration of the pixel PX is not limited to FIG. 4 and may be modified for implementation.

An organic light-emitting diode OLED may be a front-surface light-emitting diode or a rear-surface light-emitting diode. The pixel PX includes a first transistor T1 (or a switching transistor), a second transistor T2 (or a driving transistor), and a capacitor Cst as a pixel driving circuit for driving the organic light-emitting diode OLED. Through the power line PL, a first power voltage ELVDD is provided to the second transistor T2, and a second power voltage ELVSS is provided to the organic light-emitting diode OLED. The second power voltage ELVSS may be a voltage lower than the first power voltage ELVDD.

The first power voltage ELVDD and the second power voltage ELVSS may be provided from the first circuit board MPCB through the power line of the second circuit board FPCB. Descriptions related to this will be given later.

The first transistor T1 outputs a data signal applied to the data line DL in response to a scan signal applied to the scan line GL. The capacitor Cst is charged with a voltage corresponding to the data signal received from the first transistor T1. The second transistor T2 is connected to the organic light-emitting diode OLED. The second transistor T2 controls a driving current flowing through the organic light-emitting diode OLED in response to the amount of electric charge stored in the capacitor Cst.

An equivalent circuit is only one example and the embodiments of the inventive concept are not limited thereto. The pixel PX may further include a plurality of transistors and may include a larger number of capacitors. That is, according to some embodiments, the pixel PX may include additional electrical components and/or a different arrangement of electrical components without departing from the spirit and scope of embodiments according to the present disclosure. The organic light-emitting diode OLED may be connected between the power line PL and the second transistor T2.

FIG. 5 is a partial cross-sectional view of the display panel DP corresponding to the equivalent circuit illustrated in FIG. 4.

A circuit element layer DP-CL, a display element layer DP-OLED, and a thin-film encapsulation layer TFE are sequentially located on the base layer BL. According to some embodiments, the circuit element layer DP-CL may include not only a buffer film BFL, a first intermediate inorganic film IL1 and a second intermediate inorganic film IL2 which are inorganic films, but also an intermediate organic film IL3 which is an organic film. Materials of the inorganic films and the organic film are not particularly limited thereto, and the buffer film BFL may be selectively arranged/omitted in some embodiments of the inventive concept.

A semiconductor pattern OSP1 (hereinafter, a first semiconductor pattern) of the first transistor T1 and a semiconductor pattern OSP2 (hereinafter, a second semiconductor pattern) of the second transistor T2 are located on the buffer film BFL. The first semiconductor pattern OSP1 and the second semiconductor pattern OSP2 may be selected or formed from any suitable semiconductor material including, for example, amorphous silicon, polysilicon, and metal oxide semiconductor.

The first intermediate inorganic film IL1 is located on the first and second semiconductor patterns OSP1 and OSP2. A control electrode GE1 (hereinafter, a first control electrode) of the first transistor T1 and a control electrode GE2 (hereinafter, a second control electrode) of the second transistor T2 are located on the first intermediate inorganic film IL1. The first control electrode GE1 and the second control electrode GE2 may be manufactured according to the same photolithography process as that of the scan lines GL (see FIG. 5A).

The second intermediate inorganic film IL2 covering the first control electrode GE1 and the second control electrode GE2 is located on the first intermediate inorganic film IL1. An input electrode DE1 (hereinafter, a first input electrode) and an output electrode SE1 (hereinafter, a first output electrode) of the first transistor T1 and an input electrode DE2 (hereinafter, a second input electrode) and an output electrode SE2 (hereinafter, a second output electrode) of the second transistor T2 are located on the second intermediate inorganic film IL2.

The first input electrode DE1 and the first output electrode SE1 are respectively connected to the first semiconductor pattern OSP1 through a first through-hole CH1 and a second through-hole CH2 penetrating the first intermediate inorganic film IL1 and the second intermediate inorganic film IL2. The second input electrode DE2 and the second output electrode SE2 are respectively connected to the second semiconductor pattern OSP2 through a third through-hole CH3 and a fourth through-hole CH4 penetrating the first intermediate inorganic film IL1 and the second intermediate inorganic film IL2. Meanwhile, according to some embodiments of the inventive concept, a portion of the first transistor T1 and the second transistor T2 may be transformed into a bottom gate structure for implementation.

The intermediate organic film IL3 covering the first input electrode DE1, the second input electrode DE2, the first output electrode SE1, and the second output electrode SE2 is located on the second intermediate inorganic film IL2. The intermediate organic film may provide a flat surface.

The display element layer DP-OLED is located on the intermediate organic film IL3. The display element layer DP-OLED may include a pixel defining film PDL and an organic light-emitting diode OLED. The pixel defining film PDL may include an organic material. A first electrode AE is located on the intermediate organic layer IL3. The first electrode AE is connected to the second output electrode SE2 through a fifth through-hole CH5 penetrating the intermediate organic layer IL3. An opening OP is defined in the pixel defining film PDL. The opening OP of the pixel defining film PDL exposes at least a portion of the first electrode AE. According to some embodiments of the inventive concept, the pixel defining film PDL may be omitted.

The pixel PX may be located in the display region DA. The display region DA may include a light-emitting region PXA and a non-light-emitting region NPXA adjacent to the light-emitting region PXA. The non-light-emitting region NPXA may surround the light-emitting region PXA. According to some embodiments, the light-emitting region PXA is defined to correspond to a partial region of the first electrode AE exposed by the opening OP.

According to some embodiments of the inventive concept, the light-emitting region PXA may overlap at least one of the first or second transistors T1 or T2. The opening OP may become wider, and the first electrode AE and a light-emitting layer EML to be described later may also become wider.

A hole control layer HCL may be arranged in common in the light-emitting region PXA and the non-light-emitting region NPXA. According to some embodiments, a common layer such as the hole control layer HCL may be formed in common in the pixels PX (see FIG. 4).

A light-emitting layer EML is located on the hole control layer HCL. The light-emitting layer EML may be located in a region corresponding to the opening OP. That is, the light-emitting layer EML may be formed separately on each of the pixels PX. The light-emitting layer EML may contain an organic material and/or an inorganic material. The light-emitting layer EML may generate colored light (e.g., a set or predetermined colored light).

According to some embodiments, a patterned light-emitting layer EML is illustrated as an example, but the light-emitting layer EML may be commonly arranged in the pixels PX. In this case, the light-emitting layer EML may generate white light. In addition, the light-emitting layer EML may have a multi-layered structure referred to as a tandem.

An electronic control layer ECL is located on the light-emitting layer EML. According to some embodiments, the electronic control layer ECL may be commonly formed in the pixels PX (see FIG. 4). A second electrode CE is located on the electronic control layer ECL. The second electrode CE is commonly arranged in the pixels PX.

The thin-film encapsulation layer TFE is located on the second electrode CE. The thin-film encapsulation layer TFE is commonly located in the pixels PX. According to some embodiments, the thin-film encapsulation layer TFE directly covers the second electrode CE. According to some embodiments of the inventive concept, a capping layer covering the second electrode CE may be further located between the thin-film encapsulation layer TFE and the second electrode CE. In this case, the thin-film encapsulation layer TFE may directly cover the capping layer.

According to some embodiments of the inventive concept, the organic light-emitting diode OLED may further include a resonance structure for controlling a resonance distance of light generated from the light-emitting layer EML. The resonance structure is located between the first electrode AE and the second electrode CE, and the thickness of the resonant structure may be determined according to the wavelength of light generated by the light-emitting layer EML.

Figure 6A:
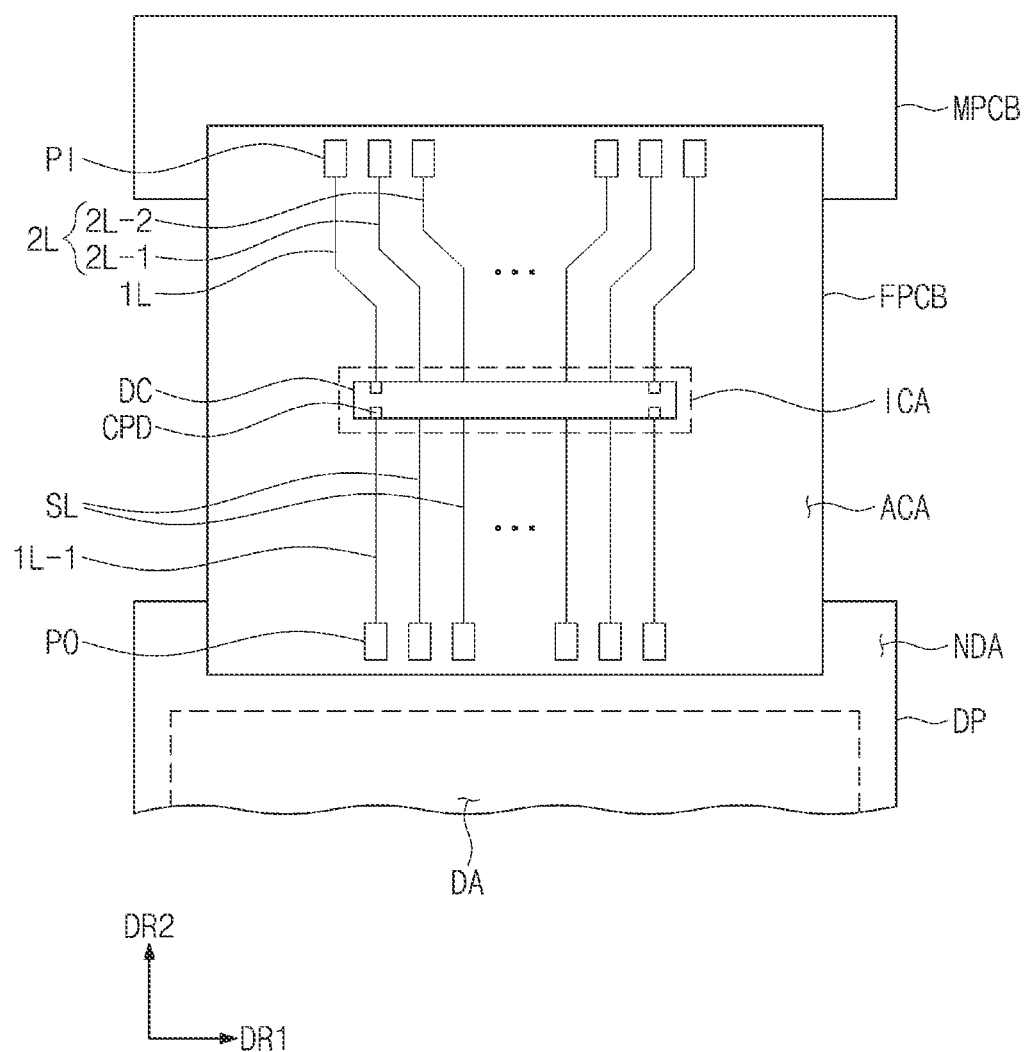
FIG. 6A is a plane view of a second circuit board according to some embodiments of the inventive concept.
Figure 6B:
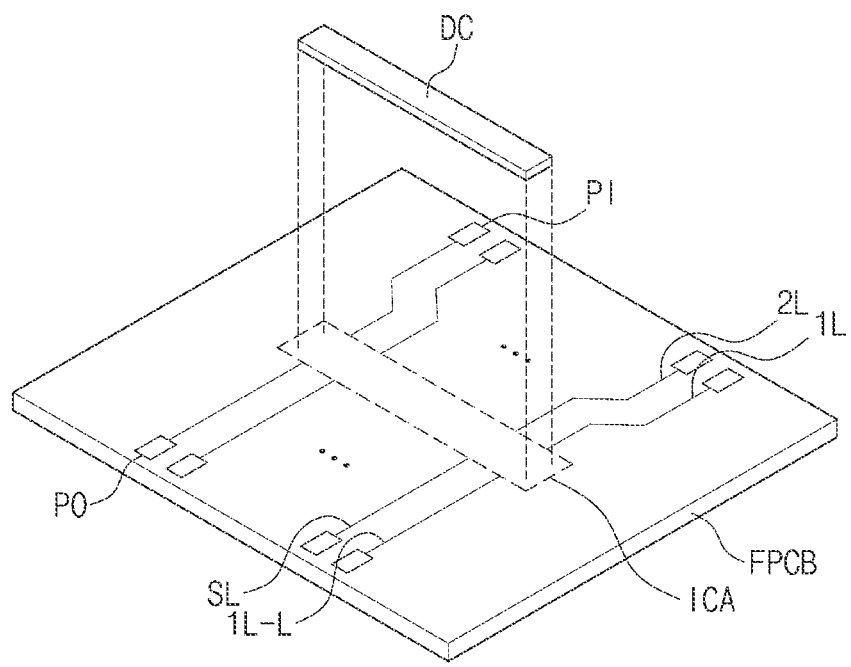
FIG. 6B is a perspective view of the second circuit board according to some embodiments of the inventive concept.
Figure 7:
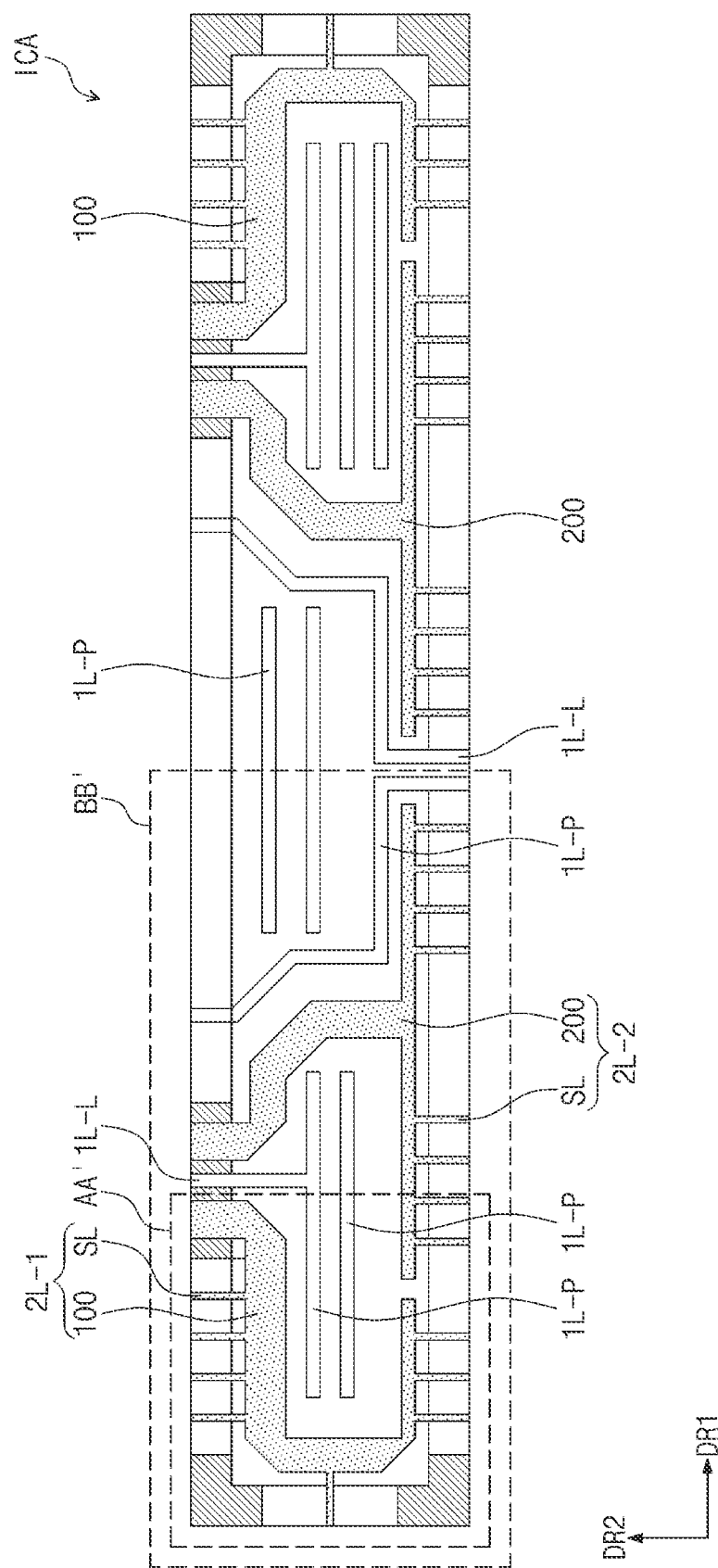
FIG. 7 is a plane view of the chip-mounting region of the second circuit board according to some embodiments of the inventive concept.

FIG. 6A is a plane view of a second circuit board according to some embodiments of the inventive concept. FIG. 6B is a perspective view of the second circuit board according to some embodiments of the inventive concept. FIG. 7 is a plane view of the chip-mounting region of the second circuit board according to some embodiments of the inventive concept. Hereinafter, descriptions will be given with reference to FIGS. 6A to 7.

In FIGS. 6A and 6B, the second circuit board FPCB is located between the first circuit board MPCB and the display panel DP on a plane to electrically connect the first circuit board MPCB and the display panel DP.

The second circuit board FPCB may have a first region ICA, which is a chip-mounting region on which a driving chip DC is mounted, and a second region ACA, which is an active region surrounding the first region ICA, the first region ICA and the second region ACA being defined therein. A plurality of lines and a plurality of pads may be located in the second region ACA of the second circuit board FPCB. According to some embodiments, a first line 1L and a second line 2L may be located in the second region ACA. The driving chip DC may be mounted on the first region ICA.

The first line 1L may correspond to a driving-chip power line that is electrically connected to the driving chip DC to supply power to the driving chip DC. The first line 1L may include a line portion 1L-L and a pad portion 1L-P (see FIG. 8). The line portion 1L-L is located in the first region ACA, and the pad portion 1L-P is located in the second region ICA. The first line 1L may be electrically connected to the driving chip DC through the pad portion 1L-P.

The second line 2L is electrically connected to the display panel DP and is not electrically connected to the driving chip DC. The second line 2L may include a plurality of power lines that provide power to the display panel DP. For example, the second line 2L may include a first power line 2L-1 and a second power line 2L-2. One of the first power line 2L-1 and the second power line 2L-2 may provide the first power voltage ELVDD to the pixel PX (see FIG. 4) of the display panel DP, and the other thereof may provide the second power voltage ELVSS thereto.

According to some embodiments, the second circuit board FPCB may include an input pad PI and an output pad PO. The input pad PI may electrically connect the first circuit board MPCB and the second circuit board FPCB. The output pad PO may electrically connect the second circuit board FPCB to the display panel DP.

According to some embodiments, the second circuit board FPCB may receive the first power voltage ELVDD (see FIG. 4) and the second power voltage ELVSS (see FIG. 4) from the first circuit board MPCB through the input pad PI and provide the voltages to the display panel DP through the output pad PO by way of the second line 2L.

Referring further to FIG. 7, the second line 2L may include common lines 100 and 200 and output lines SL. The output lines SL may include a first output line SL1 to a fourth output line SL4. The first power line 2L-1 may include the common line 100 and output lines SL1 to SL3. The second power line 2L-2 may include the common line 200 and output lines SL4.

The common lines 100 and 200 may be located in the first region ICA. The output lines SL are connected to the common lines 100 and 200 and extend to the second region ACA.

The first line 1L and the second line 2L may be connected to the display panel DP through the first region ICA which is a chip-mounting region. The common lines 100 and 200 of the second line 2L may be located in the first region ICA. The first line 1L is electrically connected to the driving chip DC in the first region ICA, and the second line 2L may be connected to the display panel DP through the output lines SL by way of the common lines 100 and 200 bypassing the first line IL in the first region ICA. More detailed descriptions will be given with reference to FIGS. 8 to 10B.

Figure 8:
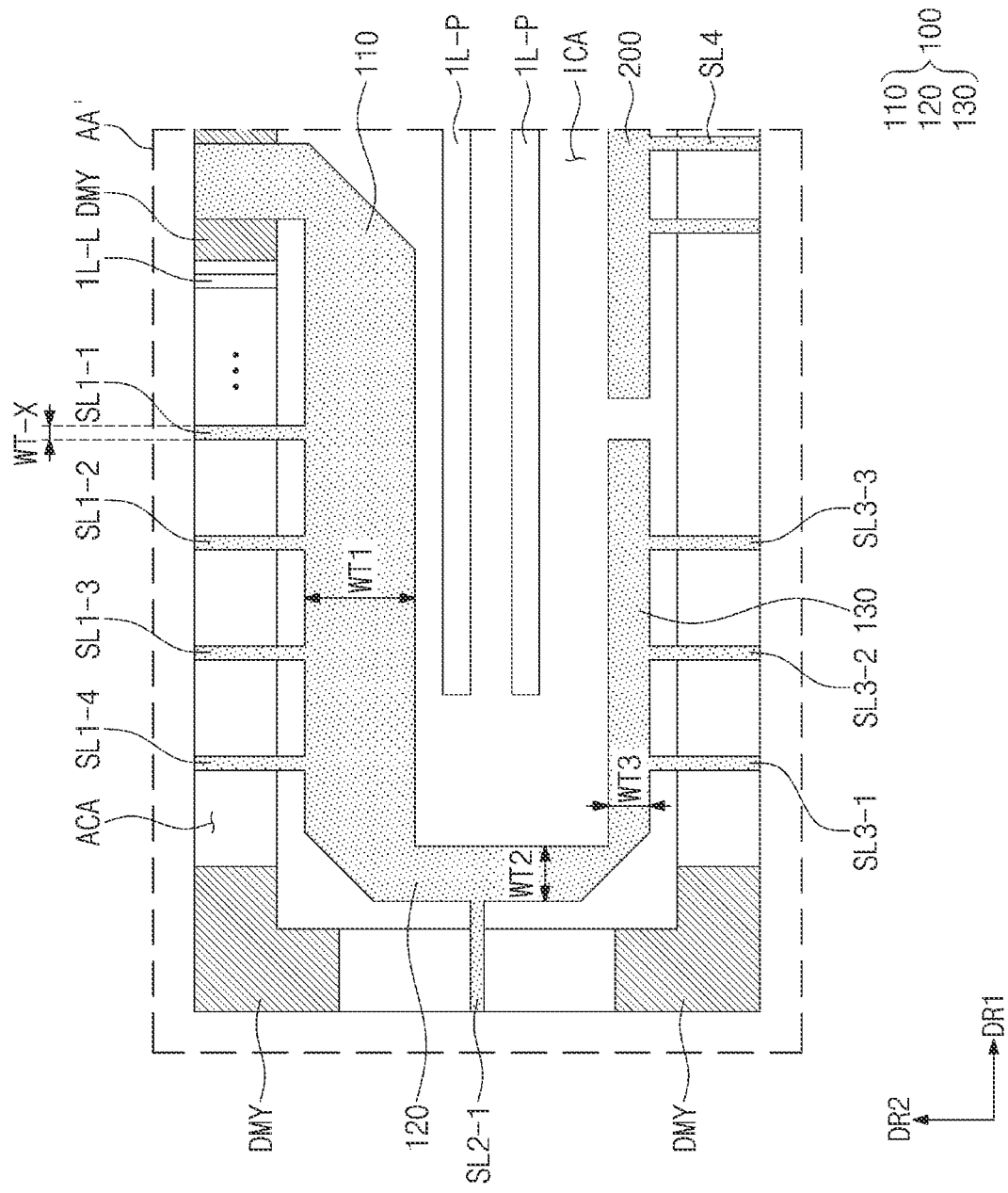
FIG. 8 is an enlarged view of a partial region of the chip-mounting region in FIG. 7 according to some embodiments of the inventive concept.

FIG. 8 is an enlarged view of a partial region of the chip-mounting region in FIG. 7 according to some embodiments of the inventive concept. FIG. 8 is an enlarged view of the region AA' of FIG. 7.

FIG. 8 illustrates the common line 100 and the output lines SL1 to SL3 of the first power line 2L-1 among the second line 2L.

Referring to FIG. 8, the first line 1L may include a plurality of pad portions 1L-P in the first region ICA. The first line 1L may include a plurality of line portions 1L-L extending from the first region ICA to the second region ACA. The line portions 1L-L may be provided in plurality, and the output portions SL1 to SL3 of the second line 2L may be located between the plurality of line portions 1L-L.

The second line 2L may include the common line 100 and the output lines SL1 to SL3 in the first region ICA. The common line 100 is electrically insulated from the driving chip DC. The common line 100 is arranged so as to bypass the plurality of pad portions 1L-P.

The common line 100 may include a first portion 110, a second portion 120, and a third portion 130. The first portion 110 is adjacent to the first circuit board MPCB (see FIG. 6A) and extends in the first direction DR1. The second portion 120 extends vertically from the first portion 110. That is, the second portion 120 extends in the second direction DR2 from the end of the first portion 110. The third portion 130 extends vertically from an end portion of the second portion 120 that is not connected to the first portion 110. That is, the third portion 130 may be adjacent to the display panel DP (see FIG. 6A) and extend in the first direction DR1.

In order to supply power to the display panel DP from the first circuit board MPCB, a current flows from the first portion 110 to the third portion 130 through the second portion 120. The current may be output to the plurality of output lines SL1 to SL3 connected to the common line 100 to flow to the display panel DP.

The width of the common line 100 gradually (e.g., in segments or portions) decreases from the first portion 110 to the third portion 130. Here, the width may correspond to a length in a direction perpendicular to the longitudinal direction of the line. That is, a first width WT1 of the first portion 110 may be greater than a second width WT2 of the second portion 120, and the second width WT2 of the second portion 120 may be greater than a third width WT3 of the third portion 130.

The common line 100 may be connected to a plurality of output lines SL1 to SL3 extending to the second region ACA and connected to the display panel DP. According to some embodiments, the first portion 110 may be connected to four first output lines SL1-1 to SL1-4. The second portion 120 may be connected to one second output line SL2-1. The third portion 130 may be connected to three third output lines SL3-1 to SL3-3. Widths WT-X of the plurality of output lines SL1 to SL3 may be the same as each other.

Hereinafter, it is assumed that the width WT-X of each of the output lines SL1 to SL3 is about 10 um.

The width of the common line 100 may be proportional to the number of the plurality of output lines SL1 to SL3. For example, when the number of the plurality of output lines SL1 to SL3 is 8, the width of the common line 100 may be about 80 um, and when the number of the plurality of output lines SL1 to SL4 is 16, the width of the common line 100 may be about 160 um. When the number of the output lines SL1 to SL3 is 4, the width of the common line 100 may be about 40 um. That is, the width of the common line 100 and the number of the plurality of output lines SL1 to SL3 may be provided in a ratio of 10 (um) to 1 (number).

The width of the common line 100 may be designed to be sufficiently great for power stabilization. The ratio of the width of the common line 100 to the number of output lines SL1 to SL3 may be 10+a (um):1 (number). For example, when the number of the plurality of output lines SL1 to SL3 is 8, the width of the common line 100 may be about 100 um. In this case, a is 20. That is, as the number of the output lines SL1 to SL3 connected to the common line 100 increases, the width of the common line 100 may increase.

According to some embodiments, the width of the common line 100 decreases as the common line 100 becomes farther away from the first circuit board MPCB (see FIG. 6A) and closer to the display panel DP (see FIG. 6A).

According to some embodiments, the number of the first output lines SL1 may be n, the number of the second output lines SL2 may be m, and the number of the third output lines SL3 may be l.

Hereinafter, the width WT-X of each of the output lines SL1 to SL3 is referred to as x. The first width WT1 of the first portion 110 of the common line 100 may be proportional to the number of the first to third output lines SL1 to SL3. When n+m+l, which is the number of the first to third output lines SL1 to SL3, increases, the first width WT1 increases by a value obtained by multiplying n+m+l by x.

In FIG. 8, when the number n of the first output lines SL1-1 to SL1-4 is 4, the number m of the second output lines SL2-1 is 1, and the number l of the third output lines SL3-1 to SL3-3 is 3, the first width WT1 may be about 80 um.

The second width WT2 of the second portion 120 is smaller than the first width WT1. The second width WT2 may be proportional to the sum of the number of each of the second and third output lines SL2 and SL3 connected to the second portion 120 and the third portion 130. That is, when m+l, which is the number of the second and third output lines SL3 and SL3, increases, the first width WT1 increases by a value obtained by multiplying m+l by x.

In FIG. 8, the number m of the second output lines SL2 is 1 and the number l of the third output lines SL3 is 3. The second width WT2 may be about 40 um.

The third width WT3 of the third portion 130 is smaller than the second width WT2. The third width WT3 may be proportional to the number of the third output lines SL3 connected to the third portion 130. That is, when l, which is the number of the third output lines SL3, increases, the third width WT3 increases by a value obtained by multiplying l by x.

In FIG. 8, the number l of the third output lines SL3 is 3. The third width WT2 may be about 30 um.

Each of the first width WT1, the second width WT2, and the third width WT3 may be designed to be sufficiently greater by as much as +a um for power stabilization. The a may be a stabilization constant for power stabilization. The stabilization constant a may correspond to twice the width WT-X of each of the output lines SL1 to SL3. That is, when the width WT-X of each of the output lines SL1 to SL3 is about 10 um, a may be 20.

That is, in FIG. 8, when n is 4, m is 1, and l is 3, the first width WT1 may be about 100 um, the second width WT2 may be about 60 um, and the third width WT3 may be about 50 um. In this case, a is about 20 um.

Figure 9A:
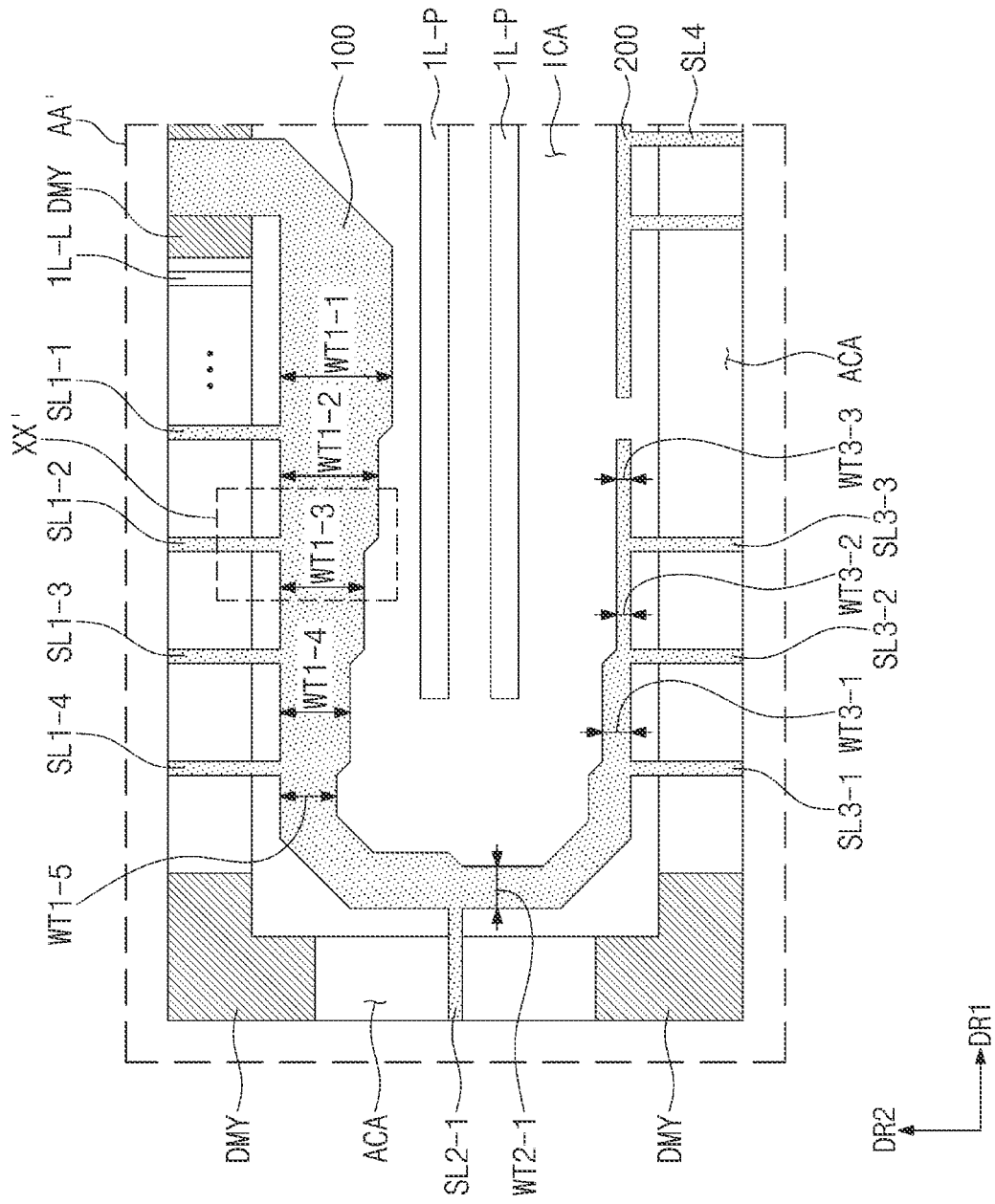
FIGS. 9A and 9B are enlarged views of partial regions of the chip-mounting region in FIG. 7 according to some embodiments of the inventive concept.
Figure 9B:
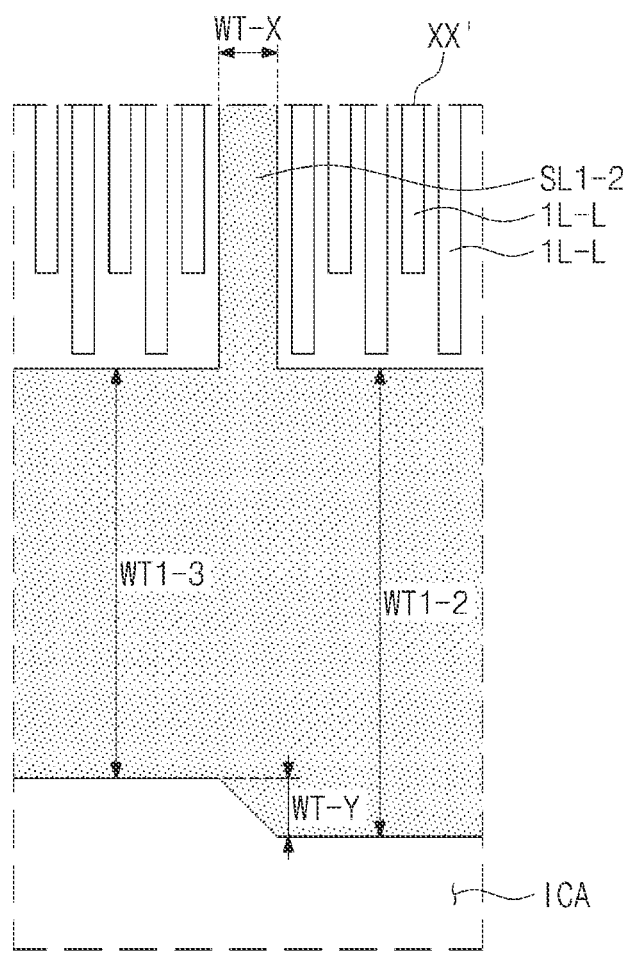

FIGS. 9A and 9B are enlarged views of partial regions of the chip-mounting region in FIG. 7 according to some embodiments of the inventive concept. FIG. 9A is an enlarged view of the region AA' of FIG. 7. FIG. 9B is an enlarged view of the region) XX' of FIG. 9A.

Referring to FIG. 9A, the width of the common line 100 may gradually decrease as the common line 100 becomes farther away from the first circuit board MPCB (see FIG. 6A) and closer to the display panel DP.

The width of the common line 100 may decrease by a width WT-X of each of the output lines SL1 to SL3 whenever the common line 100 passes by each of the plurality of connected output lines SL1 to SL3.

According to some embodiments, the width WT-X of each of the output lines SL1 to SL3 may be x, and the number of the plurality of output lines SL1 to SL3 may be z. The maximum value of the width of the common line 100 may correspond to a value obtained by multiplying x by z. The width of the common line 100 has a maximum value when the common line 100 does not at all pass by the output lines SL1 to SL3. That is, the width of a portion closest to the first circuit board MPCB within the common line 100 in the first region ICA may be the greatest.

The direction in which the common line 100 passes by the output lines SL1 to SL3 is referred to as a heading direction, and the heading direction is defined as a direction in which current flows. The current flowing direction corresponds to a direction in which the distance from the first circuit board MPCB increases and the distance to the display panel DP decreases.

Referring to FIG. 8, when the width WT-X of each of the output lines SL1 to SL3 is x and the number of the first to fourth output lines SL1 to SL4 is (n+m+l), the maximum width of the common line 100 may correspond to a value obtained by multiplying (n+m+l) by x. For example, that is, a first width WT1-1 of the common line 100 may correspond to about 80 um, and when the stabilization constant a is added, the first width WT1-1 of the common line 100 may be about 80 um to about 100 um. That is, the maximum width may be about 80 um to about 100 um.

When the common line 100 passes by a 1st first output line SL1-1 from the first width WT1-1 of the common line 100, the width of the common line 100 may be reduced by the width WT-X of the 1st first output line SL1-1. Accordingly, a second width WT1-2 may be about 70 um to about 90 um. A third width WT1-3 may be about 60 um to about 80 um after the common line 100 passes by a 2nd first output line SL1-2. A fourth width WT1-4 may be about 50 um to about 70 um after the common line 100 passes by a 3rd first output line SL1-3. A fifth width WT1-5 may be about 40 um to about 60 um after the common line 100 passes by a 4th first output line SL1-4. A sixth width WT2-1 may be about 30 um to about 50 um after the common line 100 passes by a 1st second output line SL2-1. A seventh width WT3-1 may be about 20 um to about 40 um after the common line 100 passes by a 1st third output line SL3-1. An eighth width WT3-2 may be about 10 um to about 30 um after the common line 100 passes by a 2nd third output line SL3-2. A last width WT3-3 may be about 10 um to about 30 um after the common line 100 passes by a 3rd third output line SL3-3. That is, the minimum width of the common line 100 may be about 10 um to about 30 um. Since no output line exists after the last width WT3-3, the last width WT3-3 may be the same as the eighth width WT3-2.

According to some embodiments, the minimum width of the common line 100 may be the same as the width WT-X of each of the output lines.

The widths WT1-1 to WT3-3 of the common line are proportional to the total number of output lines located next in the heading direction. The widths WT1-1 to WT3-3 of the common line may be values obtained by multiplying the width WT-X of each of the output lines by the total number of the output lines arranged next.

For example, since there are 7 output lines after the second width WT1-2, the second width WT1-2 may be about 70 um which is obtained by multiplying 7 by about 10 um, which is the width of each of the output lines WT-X.

The last width WT3-3 may be the same as the eighth width WT3-2 since there is no output line thereafter.

Referring to FIG. 9B, a reduced width WT-Y of the common line 100 may be the same as the width WT-X of each of the output lines. The third width WT1-3 may be obtained by subtracting the reduced width WT-Y, equal to the width WT-X of the 2nd first output line SL1-2, from the second width WT1-2.

In FIG. 9B, the 2nd first output line SL1-2 may be located between the line portions 1L-L of the first line 1L located in the second region ACA. That is, the plurality of output lines SL (see FIG. 7) may extend to the second region ACA and may be located between the line portions 1L-L of the first line 1L.

Figure 10B:
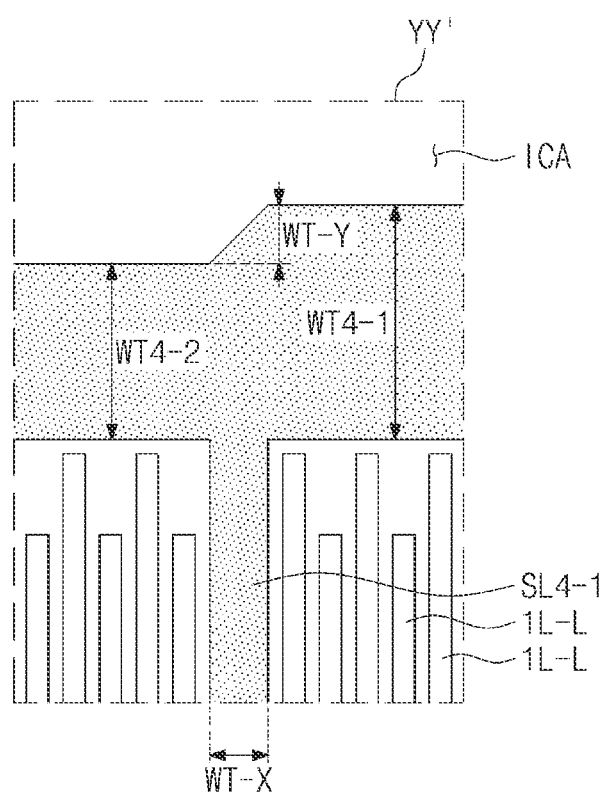

FIGS. 10A and 10B are enlarged views of partial regions of the chip-mounting region in FIG. 7 according to some embodiments of the inventive concept. FIG. 10A is an enlarged view of the region BB' of FIG. 7. FIG. 10B is an enlarged view of the region YY' of FIG. 10A.

The second line 2L may include a first power line 2L-1 (see FIG. 6A) and a second power line 2L-2 (see FIG. 6A). The first power line 2L-1 (see FIG. 6A) and the second power line 2L-2 (see FIG. 6A) may be located adjacent to each other with the pad portion 1L-P of the first line 1L interposed therebetween.

Referring to FIG. 10A, a common line 200 of any one of the first power line 2L-1 (see FIG. 6A) and the second power line 2L-2 (see FIG. 6A) may include a first common portion 210 and a second common portion 220 extending in both directions from the first direction DR1. Hereinafter, the second power line 2L-2 will be described.

The first common portion 210 and the second common portion 220 of the second power line 2L-2 are arranged symmetrically to each other. The width of the first common portion 210 and the width of the second common portion 220 may be respectively reduced as the first and second common portions 210 and 220 become farther away from each other.

The second line 2L may include a plurality of output lines SL4 connected to the common line 200 and extending to the second region ACA.

According to some embodiments, the output lines SL4 may be connected to the extending first common portion 210 and second common portion 220, respectively. Since the first and second common portions 210 and 220 are symmetrical to each other, the number of the first output lines SL4 located in the first common portion 210 and the number of the second output lines located in the second common portion 220 may be the same as each other.

In FIG. 10A, output lines SL4-1 to SL4-4 of the first common portion 210 are described.

Widths WT4-1 to WT4-4 of the first common portion 210 of the common line 200 may gradually decrease from the first output line SL4-1 to the fourth output line SL4-4.

According to some embodiments, the first width WT4-1 has a maximum value. The common line 200 includes a first common portion 210 and a second common portion 220, and the width of each of the first common portion 210 and the second common portion 220 may have a maximum value of about 40 um. The second width WT4-2 may have a value obtained by subtracting the width of the output line SL4 from the first width WT4-1. That is, the second width WT4-2 may be about 30 um. The third width WT4-3 is about 20 um and the fourth width WT4-4 is about 10 um. The fourth width WT4-4 is the same as the width of each of the output lines SL4-1 to SL4-4.

The width of the common line 200 may be proportional to the number of output lines SL4. That is, the overall width of the common line 200 may increase as the number of output lines SL4 increases.

The difference between the maximum and minimum values of the widths WT4-1 to WT4-4 of the common lines may be proportional to the number of the output lines SL4-1 to SL4-4. In FIG. 10A, when there are four output lines SL4, the maximum value of the width of the first common portion 210 is about 40 um and the minimum value thereof is about 10 um. The difference is about 30 um. When there are three output lines SL4, the maximum value is about 40 um and the minimum value is about 20 um, and in this case, the difference value is about 20 um. That is, the number of the output lines SL4 may be proportional to the difference between the maximum and minimum values of the width of the common line 200.

The sum of the width of the first common portion 210 and the width of the second common portion 220 corresponds to about 80 um. The maximum value of the width of the common line 100 of the first power line 2L-1 may correspond to about 80 um.

Referring to FIG. 10B, there is a difference of the reduced width WT-Y between the first width WT4-1 and the second width WT4-2 of the first common portion 210. The reduced width WT-Y may be the same as the width WT-X of the 1st first output line SL4-1.

The output line SL4-1 extending from the first common portion 210 of the first region ICA to the second region ACA may be located between the line portions 1L-L of the plurality of first lines.

The display device according to some embodiments of the inventive concept may make it possible to spatially and efficiently arrange power lines in a display panel on a driving chip. The display device according to some embodiments of the inventive concept may make it possible to reduce the width of power lines and increase a space in which other lines are located.

As described above, embodiments have been disclosed in the drawings and specifications. Although specific terms have been used herein, these are only used for the purpose of describing the present invention and are not used to limit the meaning or the scope of the present invention described in the claims. Therefore, those of ordinary skill in the art will understand that various modifications and other equivalent embodiments are possible from this. Therefore, the true technical protection scope of the present invention should be determined by the technical idea of the appended claims, and their equivalents.

What is claimed is:

1. A display device comprising:
a display panel in which pixels are arranged;
a first circuit board configured to provide a first driving signal to the display panel; and
a second circuit board connecting the display panel and the first circuit board and having a first region in which a driving chip providing a second driving signal to the display panel is arranged and a second region surrounding the first region, the first region and the second region being defined in the second circuit board,
wherein:
the second circuit board comprises a first line electrically connected to the driving chip and a second line electrically insulated from the driving chip;
the second line comprises a common line in the first region; and
a width of the common line decreases as the common line becomes farther away from the first circuit board on a plane.

2. The display device of claim 1, wherein the common line comprises:
a first portion adjacent to the first circuit board and extending in a first direction;
a second portion having a first end connected to the first portion and extending in a direction away from the first circuit board in a second direction orthogonal to the first direction from the first portion; and
a third portion extending in the first direction from a second end opposite to the first end of the second portion and adjacent to the display panel,
wherein a first width of the first portion is greater than a second width of the second portion and the second width is greater than a third width of the third portion.

3. The display device of claim 1, wherein the second line comprises at least one power line configured to provide power to the display panel.

4. The display device of claim 2, wherein the second line further comprises a plurality of output lines extending to the second region from the common line, and the plurality of output lines have a same width.

5. The display device of claim 4, wherein the output lines comprise n (n being a whole number greater than 0) first output lines connected to the first portion, m (m being a whole number greater than 0) second output lines connected to the second portion, and l (l being a whole number greater than 0) third output line connected to the third portion.

6. The display device of claim 5, wherein the number of the plurality of output lines connected to the common line is proportional to the width of the common line.

7. The display device of claim 5, wherein:
the first width of the first portion is proportional to a total sum of a number of the first output lines, a number of the second output lines, and a number of the third output lines;
the second width of the second portion is proportional to a sum of the number of the second output lines and the number of the third output lines; and
the third width of the third portion is proportional to the number of the third output lines.

8. The display device of claim 5, wherein $A=(n+m+l)x+a$ um, $B=(m+l)x+a$ um, and $C=lx+a$ um, where the width of each of the plurality of output lines is x um, A is the first width, B is the second width, C is the third width, and a is a stabilization constant.

9. The display device of claim 8, wherein the stabilization constant is 0.

10. The display device of claim 8, wherein the stabilization constant is twice the width of each of the output lines.

11. The display device of claim 1, wherein the first line comprises a pad portion in the first region and connected to the driving chip, and a line portion in the second region.

12. The display device of claim 11, wherein the common line is in the first region so as to bypass the pad portion.

13. The display device of claim 1, wherein:
the second line comprises z number of output lines connected to the common line and extending to the second region; and
the width of the common line is reduced by y um whenever the common line passes by each of the output lines in a direction away from the first circuit board.

14. The display device of claim 13, wherein a width of each of the output lines is x um, and the y is the same as the x.

15. The display device of claim 13, wherein a width of each of the output lines is x um, the y is greater by a um than the x, and the a is twice the x.

16. The display device of claim 14, wherein a maximum value of a width of the common line is xz um, and a minimum value thereof is x um.

17. A display device comprising:
a display panel;
a first circuit board configured to provide a first driving signal to the display panel; and
a second circuit board connecting the display panel and the first circuit board and having a first region in which a driving chip providing a second driving signal to the display panel is located and a second region surrounding the first region, the first region and the second region being defined in the second circuit board,
wherein:
the second circuit board comprises a first line electrically connected to the driving chip and a second line electrically insulated from the driving chip;
the second line comprises a common line including a first common portion in the first region and extending in one direction from a first direction and a second common portion extending in another direction opposite to the one direction; and
each width of the first common portion and the second common portion decreases as the first and second common portions become farther away from each other.

18. The display device of claim 17, wherein the second line comprises a plurality of output lines connected to the common line and in the second region, and a difference between a maximum value and a minimum value of a width of the common line is proportional to a number of the output lines.

19. The display device of claim 18, wherein the plurality of output lines comprise a plurality of first output lines connected to the first common portion and a plurality of second output lines connected to the second common portion, wherein a number of the first output lines is equal to a number of the second output lines.

20. The display device of claim 19, wherein a width of the first common portion decreases by a width of each of the first output lines whenever the first common portion passes by the first output lines in a direction away from the second common portion, and a width of the second common portion decreases by a width of each of the second output lines whenever the second common portion passes by the second output lines in a direction away from the first common portion.

* * * * *